(12) United States Patent
Qiu et al.

(10) Patent No.: US 10,998,305 B2
(45) Date of Patent: May 4, 2021

(54) SEMICONDUCTOR DIE (71) Applicant: Silergy Semiconductor Technology (Hangzhou) LTD, Hangzhou (CN)

(72) Inventors: Jianping Qiu, Hangzhou (CN); Yicheng Du, Hangzhou (CN); Meng Wang, Hangzhou (CN)

(73) Assignee: Silergy Semiconductor Technology (Hangzhou) LTD, Hangzhou (CN)

( * ) Notice: Subject to any disclaimer, the term of this patent is extended or adjusted under 35 U.S.C. 154(b) by 0 days.

(21) Appl. No.: 16/537,769

(22) Filed: Aug. 12, 2019

(65) Prior Publication Data
US 2020/0058635 A1 Feb. 20, 2020

(30) Foreign Application Priority Data

Aug. 20, 2018 (CN) .......................... 201810945125.X (51) Int. Cl.
*H01L 27/02* (2006.01)
*H01L 27/088* (2006.01)
*H02P 7/03* (2016.01)
*H01L 29/08* (2006.01)
*H01L 29/78* (2006.01)

(52) U.S. Cl.
CPC ........ *H01L 27/0207* (2013.01); *H01L 27/088* (2013.01); *H01L 29/0847* (2013.01); *H01L 29/7835* (2013.01); *H02P 7/04* (2016.02)

(58) Field of Classification Search
CPC ............... H01L 27/0207; H01L 27/088; H01L 29/0847; H01L 29/7835; H01L 29/7816; H01L 21/823481; H01L 27/082; H01L 21/761; H02P 7/04

USPC ........................................................ 257/392
See application file for complete search history.

(56) References Cited

U.S. PATENT DOCUMENTS

| | | | |
|---|---|---|---|
| 7,018,899 B2 | 3/2006 | Sung | |
| 7,074,659 B2 | 7/2006 | Zuniga et al. | |
| 7,230,302 B2 | 6/2007 | Lotfi et al. | |
| 7,855,407 B2 * | 12/2010 | Shim | H01L 27/14689 257/290 |
| 7,888,222 B2 | 2/2011 | You et al. | |
| 7,981,739 B1 | 7/2011 | You et al. | |
| 7,999,318 B2 | 8/2011 | Zuniga et al. | |
| 8,063,444 B2 | 11/2011 | Chang | |
| 8,119,507 B2 | 2/2012 | You | |
| 8,293,612 B2 | 10/2012 | Lee | |
| 8,319,283 B2 | 11/2012 | Min et al. | |
| 8,431,450 B1 | 4/2013 | Zuniga et al. | |

(Continued)

*Primary Examiner* — Vu A Vu
(74) *Attorney, Agent, or Firm* — Michael C. Stephens, Jr.

(57) ABSTRACT

A semiconductor die can include: first, second, third, and fourth transistors disposed at intervals, where each two of the first, second, third, and fourth transistors are separated by a separation region to form four separation regions; an isolation structure having a first doping structure of a first doping type, and a second doping structure of a second doping type, to absorb hole carriers and electron carriers flowing between the first, second, third, and fourth transistors; where the first doping structure is located in the separation region to isolate adjacent transistors in the first, second, third, and fourth transistors; and where at least a portion of the second doping structure is surrounded by the first doping structure, and the second doping structure is separated from the first doping structure.

20 Claims, 5 Drawing Sheets

(56) References Cited

U.S. PATENT DOCUMENTS

| | | |
|---|---|---|
| 8,455,340 B2 | 6/2013 | Zuniga et al. |
| 8,574,973 B1 | 11/2013 | You et al. |
| 8,581,344 B2 | 11/2013 | Liu |
| 8,716,790 B2 | 5/2014 | Lotfi et al. |
| 8,716,795 B2 | 5/2014 | You |
| 8,912,600 B2 | 12/2014 | You |
| 2010/0052052 A1 | 3/2010 | Lotfi et al. |
| 2014/0320174 A1 | 10/2014 | Lu et al. |

\* cited by examiner

SEMICONDUCTOR DIE

RELATED APPLICATIONS

This application claims the benefit of Chinese Patent Application No. 201810945125.X, filed on Aug. 20, 2018, which is incorporated herein by reference in its entirety.

FIELD OF THE INVENTION

The present invention generally relates to semiconductor technology, and more particularly to semiconductor integrated circuits and structures.

BACKGROUND

Voltage regulators, such as DC-to-DC voltage converters, are used to provide stable voltage sources for various electronic systems. Efficient DC-to-DC converters are particularly useful for battery management in low power devices (e.g., laptop notebooks, cellular phones, etc.). A switching voltage regulator can generate an output voltage by converting an input DC voltage into a high frequency voltage, and then filtering the high frequency input voltage to generate the output DC voltage. For example, the switching regulator can include a switch for alternately coupling and decoupling an input DC voltage source (e.g., a battery) to a load (e.g., an integrated circuit [IC], a light-emitting diode [LED], etc.). Lateral double-diffused metal oxide semiconductor (LDMOS) transistors may be utilized in switching regulators due to their performance in terms of a tradeoff between their specific on-resistance ($R_{dson}$) and drain-to-source breakdown voltage ($BV_{d\_s}$).

DETAILED DESCRIPTION

Reference may now be made in detail to particular embodiments of the invention, examples of which are illustrated in the accompanying drawings. While the invention may be described in conjunction with the preferred embodiments, it may be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it may be readily apparent to one skilled in the art that the present invention may be practiced without these specific details. In other instances, well-known methods, procedures, processes, components, structures, and circuits have not been described in detail so as not to unnecessarily obscure aspects of the present invention.

Semiconductor devices are generally manufactured using two complex manufacturing processes: front-end manufacturing and back-end manufacturing. Front-end manufacturing may involve the formation of a plurality of die on the surface of a semiconductor wafer. Each die on the wafer may contain active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components can be formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist may be removed, leaving behind a patterned layer. Alternatively, some types of materials can be patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface may be used to produce smaller and more densely packed active and passive components. Planarization can be used to remove material from the surface of the wafer and produce a uniformly flat surface. Planarization can involve polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer may be singulated using a laser cutting tool or saw blade. After singulation, the individual die are mounted to a package substrate that includes pins or contact pads for interconnection with other system components. Contact pads formed over the semiconductor die can then be connected to contact pads within the package. The electrical connections can be made with solder bumps, stud bumps, conductive paste, or wire bonds, as a few examples. An encapsulant or other molding material may be deposited over the package to provide physical support and electrical isolation. The finished package can then be inserted into an electrical system and the functionality of the semiconductor device is made available to the other system components.

The power switch in a switching converter/regulator may be a semiconductor transistor (e.g., a metal-oxide-semiconductor field-effect transistor [MOSFET], an insulated gate bipolar transistor [IGBT], etc.). A laterally diffused metal oxide semiconductor (LDMOS) is widely used in switching regulators as the main power switch.

Figure 1:
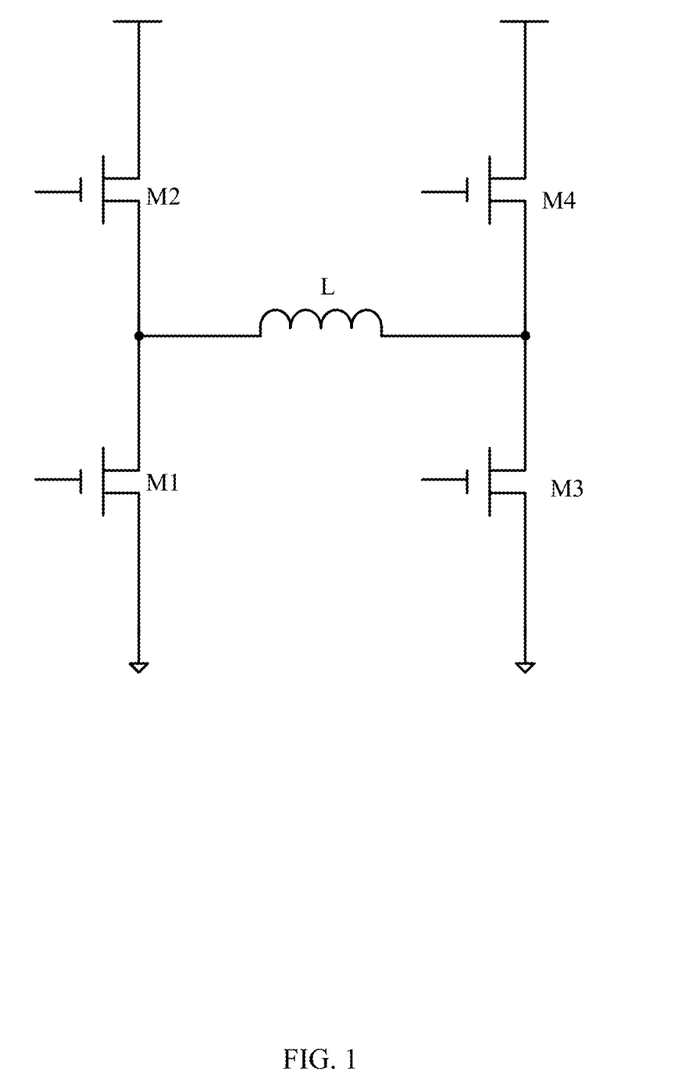
FIG. 1 is a schematic block diagram of an example motor driving circuit.

Referring now to FIG. 1, shown is a schematic block diagram of an example motor driving circuit. In the interior of the driving circuit (e.g., for a motor), multiple half-bridge circuits can be included, and the inductive load can connect between the two half-bridge circuits. In this particular example, transistor M1 is a low-voltage side transistor of a first half-bridge circuit, and transistor M2 is a high-voltage side transistor of a first half-bridge circuit. Also, transistor M3 is a low-voltage side transistor of a second half-bridge circuit, and transistor M4 is a high-voltage side transistor of a second half-bridge circuit. When transistors M2 and M3 are turned on, the inductance current may flow from transistor M2 to transistor M2 through inductance L. Then, transistors M2 and M3 can be turned off, transistors M4 and M1 may be turned on, and inductance L can be freewheeled through transistors M4 and M1.

Transistor M2 of the high-voltage side and transistor M3 of the low-voltage side may both be located in an N-type well region, both of which may include P-type body region, source region and body contact region located in body region Pbody, the gate dielectric layer, a gate conductor on the gate dielectric layer, and a drain region. The drain electrode D of high-voltage side transistor M2 can connect to input voltage VIN. The node where source electrode S of high-voltage side transistor M2 can connect to the substrate electrode may be coupled to drain electrode D of low-voltage side transistor M3 through inductance L. Also, source electrode S of low-voltage side transistor M3 can connect to ground voltage GND.

In the above freewheeling process, the parasitic PNPN structure between high-voltage side transistor M2 and low-voltage side transistor M3 may be in a forward bias state. In addition, PNP (Pbody-Nwell-Psub) and NPN (Nwell-Psub-Nwell) can be turned on in turn. When the collector current (or hole carriers) of the parasitic PNP reaches the low-voltage side and acts as the base current of the parasitic NPN to promote N-type well region of the low-voltage side to inject electrons into substrate, and when the collector current (or electron carriers) of the parasitic NPN reaches N-type well region of the high-voltage side and acts as the base current of the parasitic PNP, this can cause the PNPN thyristor to turn on and the driving chip to fail due to uncontrolled internal currents.

In particular embodiments, a semiconductor die can include first, second, third, and fourth transistors disposed at intervals, where every two transistors are separated by a separation region to form four separation regions. The semiconductor die can also include an isolation structure having a first doping structure of a first doping type and a second doping structure of a second doping type to absorb hole carriers and electron carriers flowing between the first, second, third, and fourth transistors. The first doping structure can be located in the separation region to isolate adjacent transistors in the first to fourth transistors. Also, at least a portion of the second doping structure may be surrounded by the first doping structure, and the second doping structure can be separated from the first doping structure.

Figure 2:
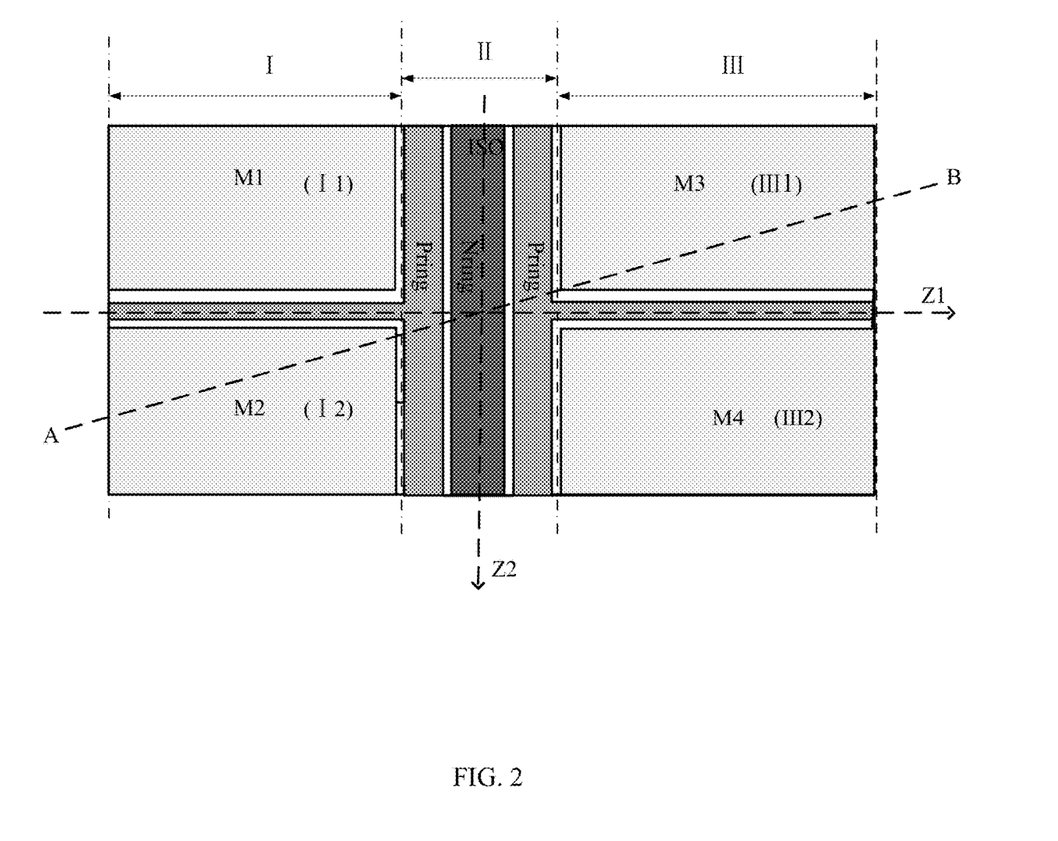
FIG. 2 is a top view diagram of a first example semiconductor die, in accordance with embodiments of the present invention.

Referring now to FIG. 2, shown is a top view diagram of a first example semiconductor die, in accordance with embodiments of the present invention. This particular example semiconductor die can include a semiconductor substrate having regions I, II, and III arranged along the length direction of the semiconductor substrate, and arranged in parallel with each other. Regions I and III may be symmetrical about axis Z2, and region II can be symmetrical about axis Z2. Region I may further include upper region I1 and lower region I2 sequentially arranged along the width direction of the semiconductor substrate. Region III may further include upper region III1 and lower region III2 sequentially arranged along the width direction of the semiconductor substrate.

At least a portion of transistor M1, at least a portion of transistor M2, at least a portion of transistor M3, and at least a portion of transistor M4 can be located in upper region I1, lower region I2, upper region III1, and lower region III2, respectively. In addition, upper region I1 and lower region I2 may be symmetrical about axis Z1. Also, upper region III1, and lower region III2 can be symmetrical about axis Z1. Region II may also be symmetrical about axis Z1. A separation region can be formed between every two transistors in the four transistors to form four separation regions, where the separation regions include region II. Axis Z1 can be parallel to the length direction of the semiconductor substrate, and axis Z2 may be parallel to the width direction of the semiconductor substrate. Regions I, II, and III may have the same length in the width direction of the semiconductor substrate.

The semiconductor die can also include an isolation structure in the separation region. For example, a length of isolation structure ISO in region II along the width direction of the semiconductor substrate may be equal to a length of region II along the width direction of the semiconductor substrate. As such, the length of isolation structure ISO along the width direction of the semiconductor substrate may be equal to a sum of a width of transistor M1 and a width of transistor M2 along the width direction of the semiconductor substrate. Further, the length of isolation structure ISO along the width direction of the semiconductor substrate may be equal to a sum of a width of transistor M3 and a width of transistor M4 along the width direction of the semiconductor substrate.

In addition, isolation structure ISO in region II can include P-type doping region Pring and N-type doping region Nring. P-type doping region Pring can be used for absorbing hole carriers flowing from lower region I2 toward upper region III1, such as hole carriers flowing from transistor M2 toward transistor M3, and absorbing hole carriers flowing from lower region III2 toward upper region I1, such as hole carriers flowing from transistor M4 toward transistor M1. N-type doping region Nring can be used for absorbing electron carriers flowing from upper region III1 toward lower region I2, such as electron carriers flowing from transistor M3 toward transistor M2, and absorbing electron carriers flowing from upper region I1 toward lower region III2, such as electron carriers flowing from transistor M4 toward transistor M1.

In this example, the entire region II can be occupied by isolation structure ISO. That is, the length of isolation structure ISO in the width direction of the semiconductor substrate may be equal to the length of region II. Isolation structure ISO can be located between transistors M2 and M3, and the shortest distance between transistors M2 and M3 may not be less than a first predetermined distance. That is, isolation structure ISO may span the shortest distance between transistors M2 and M3. Further, isolation structure ISO can also be located between transistors M4 and M1, and the shortest distance between transistors M4 and M1 may not be less than a second predetermined distance. That is, isolation structure ISO may span the shortest distance between transistors M4 and M1.

Here, the "first" predetermined distance can be a distance for ensuring electrical isolation between transistors M2 and M3, and the "second" predetermined distance is a distance for ensuring electrical isolation between transistors M4 and M1. Therefore, the first predetermined distance may be set according to the current and voltage levels between transistors M2 and M3, and the second predetermined distance may be set according to the current and voltage levels between transistors M4 and M1. The process level of the pair of transistors M2 and M3, and the process level of the pair of transistors M4 and M1 can be similar, while the current level and voltage level may also be similar Therefore, the first predetermined distance and the second predetermined distance can be designed to be equal.

In order to reduce the area occupied by isolation region ISO as much as possible, the shortest distance between transistors M2 and M3 can be the first predetermined distance. That is, isolation structure ISO may span the first predetermined distance between transistors M2 and M3. Also, the shortest distance between transistors M4 and M1 can be the second predetermined distance. That is, isolation structure ISO may span the second predetermined distance between transistors M4 and M1. Furthermore, since isolation structure ISO is symmetrical about axis Z1, and isolation structure ISO can also be symmetrical about axis Z2.

In particular embodiments, isolation structure ISO can be a rectangular structure, and the length of the rectangular structure along the width direction of the semiconductor substrate may not be less than a predetermined width. Also, the width of the rectangular structure can be equal to the width of the region II along the length direction of the semiconductor substrate. For example, the predetermined width here may refer to a length of the rectangular structure that satisfies the shortest distance between transistors M2 and M3 not being less than the first predetermined distance, and the shortest distance between transistors M4 and M1 not being less than the second predetermined distance when the rectangular structure is sandwiched among transistors M1, M2, M3, and M4. Of course, the shape and area of isolation structure ISO can be set otherwise according to the specific structural requirements of the particular application.

P-type doping region Pring and N-type doping region Nring can be staggered along the axis Z1 direction. P-type doping region Pring and N-type doping region Nring may both be symmetrical about axis Z2. Also, P-type doping region Pring and N-type doping region Nring may also be symmetrical about axis Z1. In this example, isolation structure ISO can include a first P-type doping region adjacent to region I, a second P-type doping region adjacent to region III, and N-type doping region Nring between the first and second P-type doping regions.

Isolation region ISO may be provided between transistors M2 and M3 (e.g., between transistors M2 and M4), and P-type doping region Pring and N-type doping region Nring can be formed in isolation region ISO. The N-type doping region may be used for absorbing the electron carriers injected from the high-voltage side, and the P-type doping region may be used for absorbing the hole carriers injected from the low-voltage side to ensure that the chip does not trigger the internal PNPN thyristor to be turned on at the rated voltage rated current. In this particular example, the P-type doping region and the N-type doping region of isolation structure ISO may span the entire region II. That is, the P-type doping region and the N-type doping region of isolation structure ISO may be located between transistors M2 and M4, and between transistors M1 and M3, to effectively prevent the parasitic PNPN thyristor between transistors M2 and M4 and the parasitic PNPN thyristor between transistors M1 and M3 from being turned on. In this way, the reliability of the chip can be improved.

In particular embodiments, transistors M1 and M2 may be symmetrical about axis Z1, and transistors M3 and M4 may also be symmetrical about axis Z1. Further, transistors M1 and M3 can be symmetrical about axis Z2, and transistors M2 and M4 may also be symmetrical about axis Z2. Transistor M1 can be a low-voltage side transistor of the first half-bridge circuit, and transistor M2 may be a high-voltage side transistor of the first half-bridge circuit. Also, transistor M3 can be a low-voltage side transistor of the second half-bridge circuit, and transistor M4 may be a high-voltage side transistor of the second half-bridge circuit. Also, a first node connected to transistors M1 and M2 (see, e.g., FIG. 1) can be coupled through inductive element L to a second node that connects transistor M3 to transistor M4.

Figure 3:
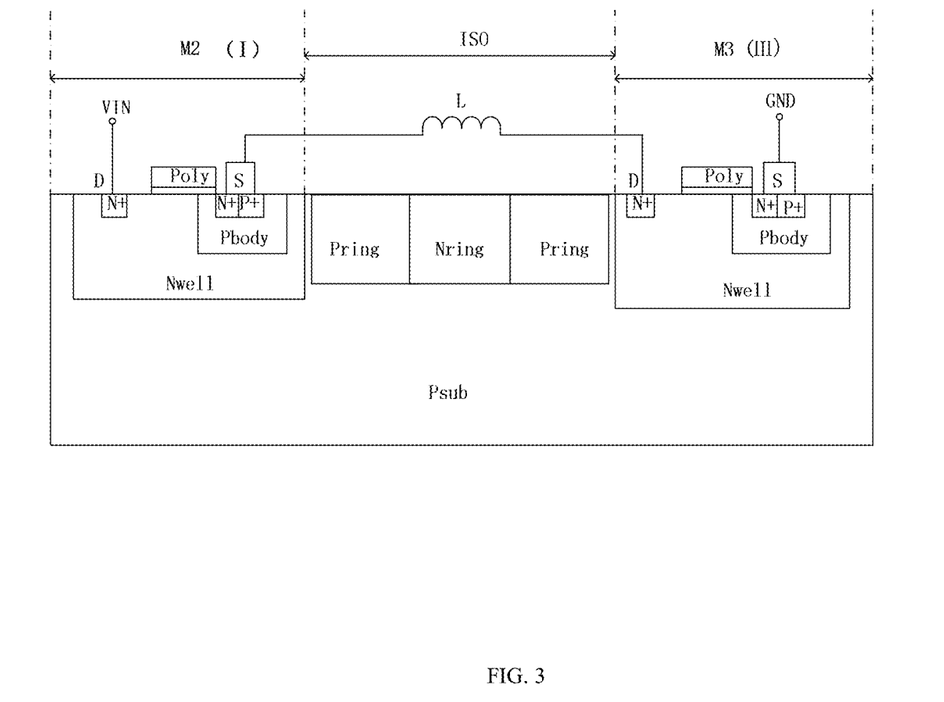
FIG. 3 is a cross-sectional view diagram of the example semiconductor die of FIG. 2 along the AB axis, in accordance with embodiments of the present invention.

Referring now to FIG. 3, shown is a cross-sectional view diagram of the example semiconductor die of FIG. 2 along the AB axis, in accordance with embodiments of the present invention. In this particular example, the semiconductor substrate is a P-type semiconductor substrate, and transistors M1, M2, M3, and M4 are N-type lateral MOSFETs. Lower region I2 may have N-type first well region Nwell, and transistor M2 can be located in first well region Nwell. P-type body region Pbody in transistor M2, first well region Nwell, and the semiconductor substrate may form a parasitic first PNP transistor. The first well region Nwell, the semiconductor substrate, and a first N-type region of transistor M3 may form a parasitic first NPN transistor. The first N-type region can be adjacent to the semiconductor substrate. When the first PNP transistor is turned on, the hole carriers may flow from the first PNP transistor toward transistor M3, and when the first NPN transistor is turned on, the electron carriers may flow from first NPN transistor toward transistor M2.

Although a cross-sectional view of transistors M1 and M4 is not shown, the arrangement of transistors M1 and M4 may be the same as that of transistors M2 and M3. That is, lower region III2 may have an N-type second well region, and transistor M4 may be located in the second well region. For example, a P-type body region in transistor M4, the second well region, and the semiconductor substrate may form a parasitic second PNP transistor. Also, the second well region, the semiconductor substrate, and a second N-type region in transistor M1 may form a parasitic second NPN transistor. The second N-type region can be adjacent to the semiconductor substrate. When the second PNP transistor is turned on, the hole carriers may flow from the second PNP transistor toward transistor M1, when the second NPN transistor is turned on, the electron carriers may flow from the second NPN transistor toward transistor M4.

In addition, an N-type third well region and an N-type fourth well region may respectively be disposed in upper regions I1 and III1, and transistors M1 and M3 may be respectively located in the third well region and the fourth well region. Transistors M1, M2, M3, and M4 can each include a P-type body region in the well region, a source region and a body contact region in the P-type body region, and a gate dielectric layer, a gate conductor Poly on the gate dielectric layer, and a drain region. A drain electrode of the high-voltage side transistor can connect to input voltage VIN, and the node connected a source electrode of the high-voltage side transistor with the substrate electrode can be coupled to a drain electrode of the low-voltage side transistor through an inductance. Also, a source electrode of the low-voltage side transistor can connect to ground voltage GND.

Referring also to FIG. 2, a separation region between transistors M1 and M2, and a separation region between transistors M3 and M4, may both be provided with a P-type contact region. The P-type contact region can be used as a contact region of the semiconductor substrate. The P-type contact region can also be used for isolating transistors M1 and M2, and isolating transistors M3 and M4. The P-type contact region can be adjacent to the P-type doping regions Pring in isolation structure ISO of region II, and the two can be integrally formed.

Figure 4:
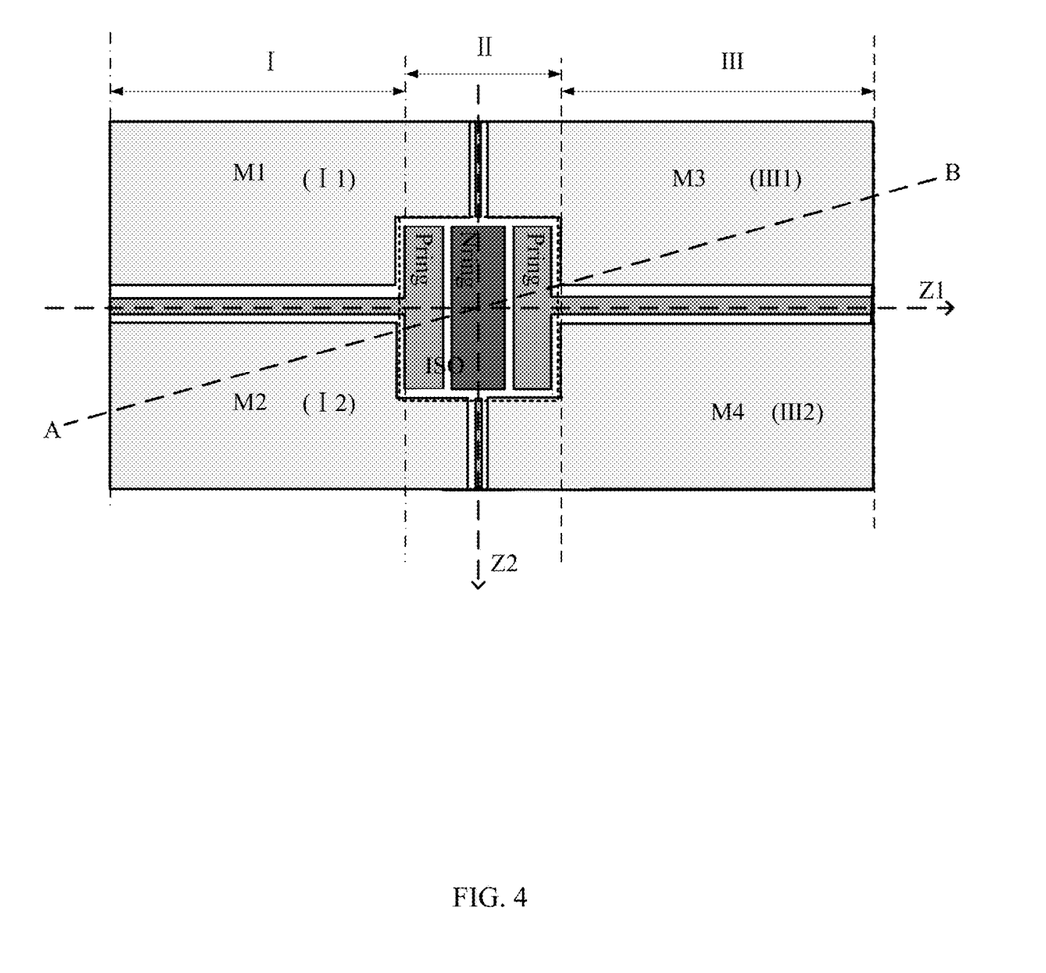
FIG. 4 is a top view diagram of a second example semiconductor die, in accordance with embodiments of the present invention.

Referring now to FIG. 4, shown is a top view diagram of a second example semiconductor die, in accordance with embodiments of the present invention. In this particular example, in order to reduce the area of isolation structure ISO, the length of isolation structure ISO along the width direction of the semiconductor substrate can be smaller than the length of region II. The semiconductor die can include isolation structure ISO in region II, and the length of isolation structure ISO along the width direction of the semiconductor substrate can be less than the length of region II along a width direction of the semiconductor substrate.

In addition, isolation structure ISO can include P-type doping region Pring and N-type doping region Nring. P-type doping region Pring can be used for absorbing the hole carriers flowing from lower region I2 toward upper region III1, such as hole carriers flowing from transistor M2 toward transistor M2, and for absorbing hole carriers flowing from lower region III2 toward upper region I1, such as hole carriers flowing from transistor M4 toward transistor M1. N-type doping region Nring may be used for absorbing electron carriers flowing from upper region III1 toward lower region I2, such as electron carriers flowing from transistor M3 toward transistor M2, and for absorbing electron carriers flowing from upper region I1 toward lower region III2, such as the electron carriers flowing from transistor M1 toward transistor M4.

Isolation structure ISO may be disposed between transistors M2 and M3, and the shortest distance between transistors M2 and M3 may not be less than a first predetermined distance. That is, isolation structure ISO may span the shortest distance between transistors M2 and M3. Isolation structure ISO can also be located between transistors M4 and M1, and the shortest distance between transistors M4 and M1 may not be less than a second predetermined distance. That is, isolation structure ISO may span the shortest distance between transistors M4 and M1.

For example, the first predetermined distance can be a distance for ensuring electrical isolation between transistors M2 and M3, and the second predetermined distance may be a distance for ensuring electrical isolation between transistors M4 and M1. Therefore, the first predetermined distance may be set according to the current and voltage levels between transistors M2 and M3, and the second predetermined distance may be set according to the current and voltage levels between transistors M4 and M1. The process level of the pair of transistors M2 and M3, and the process level of the pair of transistors M4 and M1 can be similar, and the current and voltage levels may also be similar Therefore, the first predetermined distance and the second predetermined distance can be designed to be equal.

In order to reduce the area occupied by isolation region ISO as much as possible, the shortest distance between transistors M2 and M3 can be the first predetermined distance. That is, isolation structure ISO may span the first predetermined distance between transistors M2 and M3. Also, the shortest distance between transistors M4 and M1 can be the second predetermined distance. That is, isolation structure ISO may span the second predetermined distance between transistors M4 and M1. Furthermore, since isolation structure ISO may be symmetrical about axis Z1, and also symmetrical about axis Z2.

For example, isolation structure ISO is a rectangular structure, and the length of the rectangular structure along the width direction of the semiconductor substrate may not be less than a predetermined width. Also, the width of the rectangular structure can be equal to the width of region II along the length direction of the semiconductor substrate. For example, the predetermined width here may refer to a length of the rectangular structure that satisfies the shortest distance between transistors M2 and M3 not being less than the first predetermined distance, and the shortest distance between transistors M4 and M1 not being less than the second predetermined distance, when the rectangular structure is sandwiched among transistors M1, M2, M3, and M4.

P-type doping region Pring and N-type doping region Nring can be staggered along the axis Z1 direction. P-type doping region Pring and N-type doping region Nring may both be symmetrical about axis Z2. Also, P-type doping region Pring and N-type doping region Nring may be symmetrical about axis Z1. For example, isolation structure ISO can include a first P-type doping region adjacent to region I, a second P-type doping region adjacent to region III, and the N-type doping region Nring between the first and second P-type doping regions.

Since the length of isolation structure ISO along the width direction of the semiconductor substrate is less than the length of region II, the remaining region of region II except the region occupied by isolation structure ISO may be used for manufacturing power devices. When the area of the power devices is relatively large, a portion of transistor M1 may be located in region II and adjacent to isolation structure ISO. That is, in addition to at least a portion of area of upper region I1, the area of transistor M1 may further include the area of the portion of region II. A portion of transistor M2 may be located in region II and adjacent to isolation structure ISO. That is, in addition to at least a portion of the area of lower region I2, the area of transistor M2 may also include the area of the portion of region II.

A portion of transistor M3 may be located in region II and adjacent to isolation structure ISO. That is, in addition to at least a portion of the area of upper region III1, the area of transistor M3 may further include the area of the portion of region II. A portion of transistor M4 may be located in region II and adjacent to isolation structure ISO. That is, in addition to at least a portion of the area of lower region III2, the area of transistor M4 may further include the area of the portion of region II. Thus, in the case of areas of regions I, II, and III being the same, the area of each transistor can be increased, which is advantageous for saving the overall area of the semiconductor die.

Also in FIG. 4, a separation region between transistors M1 and M2, and a separation region between transistors M3 and M4, can both be provided with a P-type contact region. P-type contact region can be used as a contact region of the semiconductor substrate. Also, the P-type contact region can be used for isolating transistors M1 and M2, and isolating transistors M3 and M4. The P-type contact region may be adjacent to the P-type doping regions Pring in isolation structure ISO of region II, and the two can be integrally formed.

Figure 5:
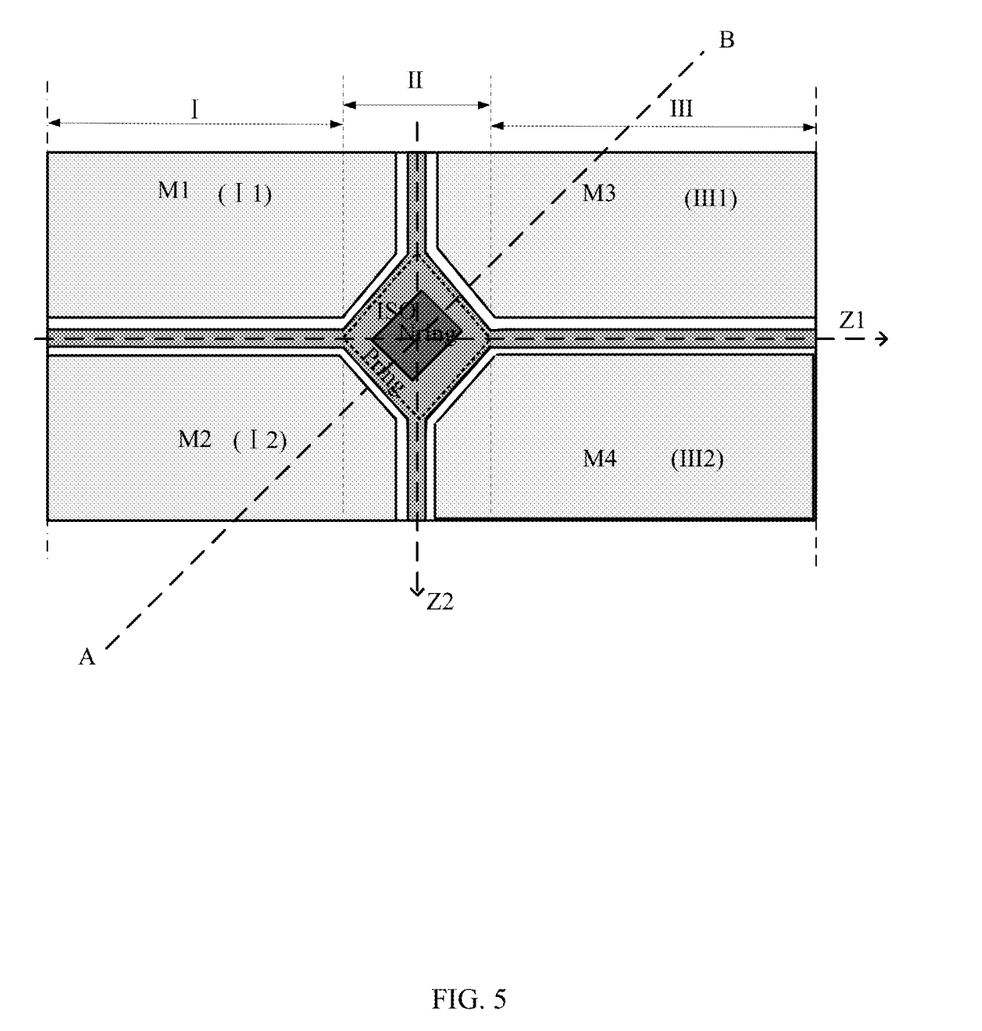
FIG. 5 is a top view diagram of a third example semiconductor die, in accordance with embodiments of the present invention.

Referring now to FIG. 5, shown is a top view diagram of a third example semiconductor die, in accordance with embodiments of the present invention. In this particular example, in order to further reduce the area of isolation structure ISO, the isolation structure can be a diamond structure. That is, N-type doping region Nring in isolation structure ISO is a diamond shape, and P-type doping regions Pring surrounding N-type doping region Nring are a diamond ring shape. A first diagonal of the diamond structure can be parallel to axis Z1, and a second diagonal of the diamond structure may be parallel to axis Z2. Also, the second diagonal of the diamond structure may not be greater than the length of region II along the width direction of the semiconductor substrate, and a side length of the diamond structure may not be less than a predetermined value. The shortest distance between transistors M2 and M3 may be the side length of the diamond structure, and the shortest distance between transistors M4 and M1 may also be the side length of the diamond structure. Therefore, the side length of the diamond structure may not be less than a predetermined value, and the predetermined value here can be the maximum value of the first and second predetermined distances.

In particular embodiments, an isolation structure can be provided between the second and third transistors, and between the first and fourth transistors, in order to effectively prevent a parasitic thyristor between transistors from turning on, thereby improving chip reliability. Further, since along the width direction of the semiconductor substrate, the length of the isolation structure may be less than the length of the second region, the remaining region of the second region except the region occupied by the isolation structure can be utilized in manufacturing the power devices. As such, the area of each power device can be made larger, which is advantageous for saving overall semiconductor die area.

The embodiments were chosen and described in order to best explain the principles of the invention and its practical applications, to thereby enable others skilled in the art to best utilize the invention and various embodiments with modifications as are suited to particular use(s) contemplated. It is intended that the scope of the invention be defined by the claims appended hereto and their equivalents.

What is claimed is:

1. A semiconductor die, comprising:
   a) a first transistor, a second transistor, a third transistor, and a fourth transistor disposed at intervals, wherein each two of the first, second, third, and fourth transistors are separated by a separation region to form four separation regions;
   b) an isolation structure having a first doping structure of a first doping type, and a second doping structure of a second doping type, to absorb hole carriers and electron carriers flowing between the first, second, third, and fourth transistors;
   c) wherein the first doping structure is located in the separation region to isolate adjacent transistors in the first, second, third, and fourth transistors; and
   d) wherein at least a portion of the second doping structure is surrounded by the first doping structure, the second doping structure is separated from the first doping structure, and the first doping structure extends a greater distance and has a different shape than the second doping structure.

2. The semiconductor die according to claim 1, wherein a shape and an area of the isolation structure are set such that a shortest distance between every two of the first, second, third, and fourth transistors satisfy an isolation requirement.

3. The semiconductor die according to claim 1, wherein the isolation structure is an isolation ring, the first doping type is a P-type, and the second doping type is an N-type.

4. The semiconductor die according to claim 1, wherein the separation regions are arranged in a cross-like structure.

5. The semiconductor die according to claim 4, wherein:
   a) the first doping structure comprises a first portion having a first branch and a second branch;
   b) the first branch isolates the two transistors in a first side of the cross-like structure from a remaining two transistors in an opposite second side; and
   c) the second branch isolates the two transistors in the first side of the cross-like structure.

6. The semiconductor die according to claim 5, wherein:
   a) the first doping structure comprises a second portion having a third branch and a fourth branch;
   b) the third branch isolates the two transistors in a first side of the cross-like structure from remaining two transistors in an opposite second side; and
   c) the fourth branch isolates the two transistors in the second side of the cross-like structure.

7. The semiconductor die according to claim 6, wherein the second doping structure is located between the first portion and the second portion of the first doping structure.

8. The semiconductor die according to claim 7, wherein the second doping structure is surrounded by the first doping structure.

9. The semiconductor die according to claim 7, wherein:
   a) the second doping structure is a rectangular shape along a center of the cross-like structure;
   b) the arrangement direction of the two transistors of first side is a first direction; and
   c) a direction perpendicular to the arrangement direction is a second direction.

10. The semiconductor die according to claim 8, wherein the second doping structure is a diamond shape along the center of said cross-like structure.

11. The semiconductor die according to claim 9, wherein the first branch and the third branch of the first doping structure are both a rectangular shape.

12. The semiconductor die according to claim 11, wherein along the second direction, the sum of a width of the first branch of the first doping structure, a width of the third branch of the first doping structure, and a width of the second doping structure are not less than a predetermined width.

13. The semiconductor die according to claim 11, wherein along the first direction, a length of the second doping structure, a length of the first branch of the first doping structure, and a length of the third branch of the first doping structure are equal.

14. The semiconductor die according to claim 13, wherein the length of the second doping structure along the first direction is equal to a total width of the two transistors in the first side along the arrangement direction, and is equal to a total width of the two transistors in the second sides along the arrangement direction.

15. The semiconductor die according to claim 13, wherein the length of the second doping structure along the first direction is less than the total width of the two transistors in the first side along the arrangement direction, and is less than the total width of the two transistors in the second side along the arrangement direction.

16. The semiconductor die according to claim 10, wherein the first branch and the third branch of said first doping structure are combined to form a diamond ring shape about a center of the cross-like structure, and the diamond shape of the second doping structure is surrounded by the diamond ring shape.

17. The semiconductor die according to claim 16, wherein:
   a) two diagonals of the diamond ring shape are coincident with that of the diamond shape, and the diamond ring shape and the diamond shape together form a diamond structure;
   b) the first diagonal of the diamond structure is parallel to the lateral direction of the cross-like structure;
   c) the second diagonal of the diamond structure is parallel to the longitudinal direction of the cross-like structure;
   d) the longitudinal direction of the cross-like structure is the arrangement direction of the two transistors in the first side, and the lateral direction of the cross-like structure is perpendicular to the longitudinal direction; and
   e) the side length of the diamond structure is not less than a predetermined value.

18. The semiconductor die according to claim 17, wherein a length of the second diagonal of the diamond structure is less than a total width of the two transistors in the first side along the arrangement direction, and is less than a total width of the two transistors in the second side along the arrangement direction.

19. The semiconductor die according to claim 6, wherein:
   a) the two transistors in the first side are disposed as first transistor of a low-voltage side and a second transistor of a high-voltage side, and are connected in series between the low-voltage end and the high-voltage end;
   b) the two transistors in the second side are disposed as third transistor of the low-voltage side and fourth transistor of the high-voltage side, and are connected in series between the low-voltage end and the high-voltage end;
   c) the first transistor is adjacent to the second and third transistors;
   d) the first doping structure is configured to absorb hole carriers flowing from the second transistor toward the third transistor, and to absorb hole carriers flowing from the fourth transistor toward the first transistor; and
   e) the second doping structure is configured to absorb electron carriers flowing from the third transistor toward the second transistor, and to absorb electrons carriers flowing from the first transistor toward the fourth transistor.

20. The semiconductor die according to claim 19, wherein:
   a) the isolation structure is located between the second and third transistors such that a shortest distance between the second and third transistors is not less than a first predetermined distance; and
   b) the isolation structure is further located between the fourth and first transistors such that a shortest distance between the fourth and first transistors is not less than a second predetermined distance.

* * * * *